United States Patent
Kurosawa et al.

(10) Patent No.: US 9,816,003 B2
(45) Date of Patent: Nov. 14, 2017

(54) METHOD OF PRODUCING STRUCTURE CONTAINING PHASE-SEPARATED STRUCTURE

(71) Applicant: Tokyo Ohka Kogyo Co., Ltd., Kawasaki-shi (JP)

(72) Inventors: Tsuyoshi Kurosawa, Kawasaki (JP); Daiju Shiono, Kawasaki (JP); Ken Miyagi, Kawasaki (JP); Tasuku Matsumiya, Kawasaki (JP); Hitoshi Yamano, Kawasaki (JP); Taku Hirayama, Kawasaki (JP); Katsumi Ohmori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/520,966

(22) Filed: Oct. 22, 2014

(65) Prior Publication Data
US 2015/0118397 A1 Apr. 30, 2015

(30) Foreign Application Priority Data
Oct. 25, 2013 (JP) .................................. 2013-222432

(51) Int. Cl.
  *B05D 1/30* (2006.01)
  *C09D 153/00* (2006.01)
  *G03F 7/00* (2006.01)
  *C08L 33/26* (2006.01)
  *B82Y 30/00* (2011.01)

(52) U.S. Cl.
  CPC ............ *C09D 153/00* (2013.01); *C08L 33/26* (2013.01); *G03F 7/0002* (2013.01); *B82Y 30/00* (2013.01)

(58) Field of Classification Search
  CPC ......................................................... B05D 1/307
  See application file for complete search history.

(56) References Cited

U.S. PATENT DOCUMENTS

| 9,029,262 B2 | 5/2015 | Senzaki et al. |
| 2006/0134556 A1* | 6/2006 | Nealey ................ B81C 1/00031 430/311 |

(Continued)

FOREIGN PATENT DOCUMENTS

| JP | A-11-283905 | 10/1999 |
| JP | A-11-283910 | 10/1999 |

(Continued)

OTHER PUBLICATIONS

Folkes, Processing, structure, and properties of block copolymers, Elsevier Applied Science Publishers, p. 8, 1986.*

(Continued)

*Primary Examiner* — James Mellott
(74) *Attorney, Agent, or Firm* — Knobbe Martens Olson & Bear LLP

(57) ABSTRACT

A method of forming a structure containing a phase-separated structure, the method including applying a block copolymer solution to a substrate to form a layer containing a block copolymer and having a film thickness of less than 100 nm; and phase-separating the layer containing the block copolymer, a solvent of the block copolymer solution comprising a poor solvent exhibiting a poor solubility for a homopolymer A of one of the blocks of the block copolymer.

2 Claims, 1 Drawing Sheet

(56) References Cited

U.S. PATENT DOCUMENTS

| | | | |
|---|---|---|---|
| 2008/0319134 A1* | 12/2008 | Ma | C08F 293/005 525/123 |
| 2009/0189317 A1 | 7/2009 | Sato et al. | |
| 2009/0263631 A1 | 10/2009 | Sakamoto et al. | |
| 2011/0262864 A1* | 10/2011 | Hirano | G03F 7/0045 430/285.1 |
| 2012/0097640 A1* | 4/2012 | Asakawa et al. | 216/44 |
| 2012/0207940 A1 | 8/2012 | Muramatsu et al. | |
| 2013/0078576 A1* | 3/2013 | Wu | C08F 293/00 430/296 |
| 2013/0210231 A1 | 8/2013 | Senzaki et al. | |
| 2014/0113236 A1 | 4/2014 | Senzaki et al. | |
| 2014/0127626 A1 | 5/2014 | Senzaki et al. | |
| 2014/0377465 A1* | 12/2014 | Trefonas et al. | 427/374.4 |
| 2015/0168834 A1* | 6/2015 | Takizawa | C08F 14/185 430/18 |

FOREIGN PATENT DOCUMENTS

| | | |
|---|---|---|
| JP | A-2007-072374 | 3/2007 |
| JP | A-2007-329276 | 12/2007 |
| JP | A-2008-036491 | 2/2008 |
| JP | A-2008-246876 | 10/2008 |
| JP | A-2012-166302 | 9/2012 |
| JP | B-5225555 | 7/2013 |
| JP | B-5227846 | 7/2013 |
| JP | A-2013-164436 | 8/2013 |
| WO | WO 2012/046770 A1 | 4/2012 |
| WO | WO 2012/169620 | 12/2012 |

OTHER PUBLICATIONS

Hinsbert et al., "Self-Assembling for Lithographic Patterning: Overview, Status and Moving Forward," Proceedings of SPIE, vol. 7637, 76370G-1 (2010).

* cited by examiner

METHOD OF PRODUCING STRUCTURE CONTAINING PHASE-SEPARATED STRUCTURE

TECHNICAL FIELD

The present invention relates to a method of producing a structure containing a phase-separated structure.

Priority is claimed on Japanese Patent Application No. 2013-222432, filed Oct. 25, 2013, the content of which is incorporated herein by reference.

DESCRIPTION OF RELATED ART

Recently, as further miniaturization of large scale integrated circuits (LSI) proceeds, a technology for processing a more delicate structure is demanded. In response to such demand, attempts have been started on forming a fine pattern using a phase-separated structure formed by self-assembly of block polymers having mutually incompatible blocks bonded together. (For example, Patent Literature 1).

For using a phase-separation structure of a block copolymer, it is necessary to form a self-organized nano structure by a microphase separation only in specific regions, and arrange the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Non-Patent Document 1).

In the chemical epitaxy process, a neutralization film containing a surface treatment agent which has affinity with any of the blocks that constitute the block copolymer is disposed on the substrate surface in a predetermined pattern. By the pattern (guide pattern) of the neutralization film disposed on the substrate surface, orientation of each phase of the phase-separated structure is controlled. Therefore, to form a predetermined phase-separated structure, it is important to dispose the neutralization film in accordance with a period of the block copolymer.

For these block copolymers, block copolymers having a block formed from a repeating unit of a styrene and a block formed from a repeating unit of methyl methacrylate (PS-b-PMMA) are being widely investigated.

In the case of forming a very fine pattern using a phase-separated structure formed by self-assembly of a block copolymer, an evaluation method is used in which the in-plane dimension uniformity (hereafter, sometimes referred to as "CDU") of the pattern dimension of the formed pattern is evaluated.

Although CDU was an important criteria for evaluating the uniformity of the hole dimension, it was difficult to improve CDU.

DOCUMENTS OF RELATED ART

Patent Literature

[Patent Document 1] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

The present invention takes the above circumstances into consideration, with an object of providing a method of producing a structure containing a phase-separated structure in which CDU is improved such that the phase-separated structure exhibits an excellent uniformity with respect to the hole dimension.

The method according to one embodiment of the present invention is a method of forming a structure containing a phase-separated structure, the method including: a step of applying a block copolymer solution to a substrate to form a layer containing a block copolymer and having a film thickness of less than 100 nm; and a step of phase-separating the layer containing the block copolymer, a solvent of the block copolymer solution comprising a poor solvent exhibiting a poor solubility for a homopolymer A of one of the blocks of the block copolymer.

In the above embodiment, the amount of the poor solvent in the solvent is preferably 50% by weight or less.

In the above embodiment, the amount of the structural unit constituting the homopolymer A in the block copolymer is preferably 50 mol % or more, and more preferably 50 to 80 mol %.

In the above embodiment, it is preferable to further include a step of forming a neutralization film on the substrate.

According to the present invention, there is provided a method of producing a structure containing a phase-separated structure in which CDU is improved such that the phase-separated structure exhibits an excellent uniformity with respect to the hole dimension.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

DETAILED DESCRIPTION OF THE INVENTION

Figure 1:
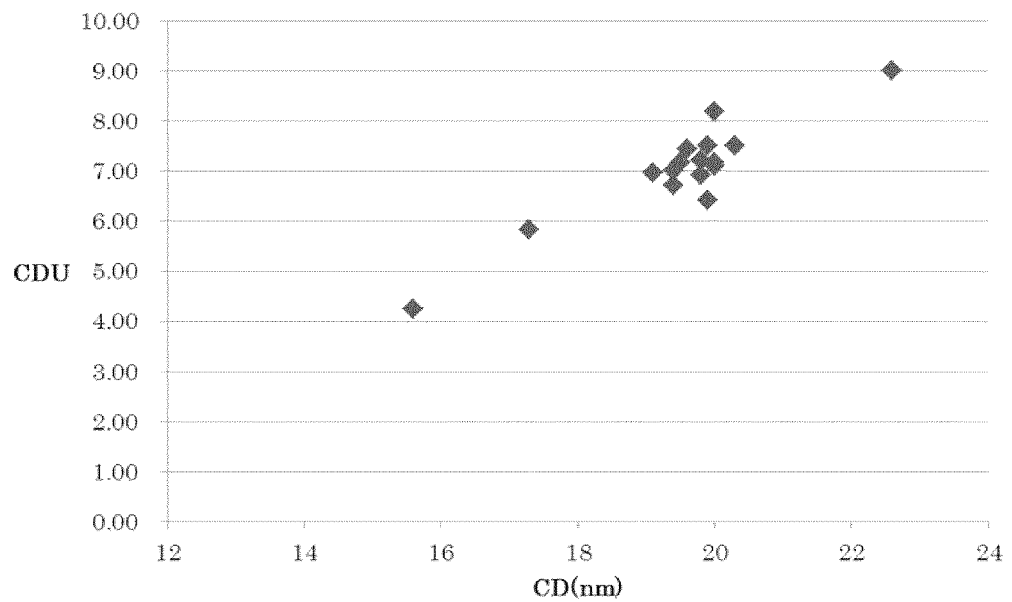
FIG. 1 is a diagram showing an example of CDU-CD correlation in comparative example.

<<Method of Producing Structure Containing Phase-Separated Structure>>

The method according to one embodiment of the present invention is a method of forming a structure containing a phase-separated structure, the method including: a step of applying a block copolymer solution to a substrate to form a layer containing a block copolymer and having a film thickness of less than 100 nm; and a step of phase-separating the layer containing the block copolymer, a solvent of the block copolymer solution comprising a poor solvent exhibiting a poor solubility for a homopolymer A of one of the blocks of the block copolymer.

[Step of Applying a Block Copolymer Solution to a Substrate to Form a Layer Containing a Block Copolymer and Having a Film Thickness of Less than 100 nm]

In the method of producing a structure containing a phase-separated structure according to the present embodiment, a block copolymer solution is applied to a substrate to form a layer containing a block copolymer and having a film thickness of less than 100 nm.

<Substrate>

There are no particular limitations on the type of a substrate, provided that the block copolymer-containing solution can be coated on the surface of the substrate. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate used in the present embodiment is not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate, an inorganic and/or organic film may be provided.

As the inorganic film, an inorganic antireflection film (inorganic BARC) can be used. As the organic film, an organic antireflection film (organic BARC) can be used.

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film-forming material, coating the organic film-forming material on a substrate using a spinner or the like, and baking under heating conditions preferably in the range of 200 to 300° C. for 30 to 300 seconds, more preferably for 60 to 180 seconds. The organic film-forming material does not need to have susceptibility to light or electron beam like a resist film, and the organic film-forming material may or may not have such susceptibility. More specifically, a resist or a resin generally used in the production of a semiconductor device or a liquid crystal display device can be used.

Further, it is preferable that the organic film-forming material can be subjected to etching, particularly dry etching, so that, by etching the organic film using a pattern of a block copolymer, the pattern can be transferred to the organic film, and an organic film pattern can be formed. It is particularly desirable to use an organic film-forming material which can be subjected to oxygen plasma etching or the like. As such an organic film-forming material, a material conventionally used for forming an organic film such as an organic BARC can be used. Examples of such an organic film-forming material include the ARC series manufactured by Brewer Science Ltd., the AR series manufactured by Rohm and Haas Company, and the SWK series manufactured by Tokyo Ohka Kogyo Co., Ltd.

In the present embodiment, as described later, a layer of a neutralization film may be formed on the substrate, and a pattern of a photosensitive resin may be formed on the neutralization film.

Before forming a layer of a neutralization film on the substrate, the surface of the substrate may be cleaned in advance. By cleaning the surface of the substrate, application of the undercoat agent may be satisfactorily conducted.

As the washing treatment, a conventional method may be used, and examples thereof include an oxygen plasma treatment, an ozone oxidation treatment, an acid alkali treatment, and a chemical modification treatment.

In the present embodiment, a block copolymer solution is applied to a substrate to form a layer containing a block copolymer and having a film thickness of less than 100 nm.

Specifically, using a spinner or the like, a block copolymer dissolved in a solvent containing a poor solvent exhibiting a poor solubility for a homopolymer A which is one of the blocks of the block copolymer is applied to a substrate in a manner such that the film thickness becomes less than 100 nm.

<Block Copolymer Solution>

Poor Solvent for Homopolymer A

The block copolymer solution is produced by dissolving a block copolymer in a solvent containing a poor solvent exhibiting a poor solubility for the homopolymer A.

In the present embodiment, a "homopolymer A" may be constituted of one of the blocks constituting the block copolymer used in the block copolymer solution. The "homopolymer A" is preferably a homopolymer constituted of a hydrophobic block within the block copolymer.

A hydrophobic block refers to a relatively highly hydrophobic block within a block copolymer containing a combination of mutually incompatible blocks.

In the case where the structural unit of the hydrophobic block is the "homopolymer A", preferable examples of the structural unit constituting the homopolymer include a structural unit having an aromatic group, a structural unit derived from an alkyleneoxide and a structural unit containing a polyhedral oligomeric silsesquioxane (POSS) structure, preferably a structural unit derived from styrene or a structural unit containing a polyhedral oligomeric silsesquioxane (POSS) structure.

In the present embodiment, it is preferable that the "homopolymer A" is constituted of 50 mol % or more of the blocks within the block copolymer, and more preferably 50 to 80 mol %. In other words, in the block copolymer solution, it is preferable to use a block copolymer in which the amount of the structural unit constituting the homopolymer A is 50 mol % or more, and more preferably 50 to 80 mol %.

The present inventors have found that, by dissolving a block copolymer in a solvent containing a poor solvent exhibiting a poor solubility for a homopolymer of one of the blocks constituting the block copolymer to produce a block copolymer solution, the CDU-CD correlation can be canceled. As a result, the present inventors have provided a method of producing a structure containing a phase-separated structure in which CDU is improved such that the phase-separated structure exhibits an excellent uniformity with respect to the hole dimension. The reason why the CDU-CD correlation can be canceled is presumed that, by virtue of dissolving in a solvent containing a poor solvent, the phase-separation of the block copolymer becomes more likely to occur.

In an effort to cancel the CDU-CD correlation, there has been considered a method in which the amount of the block constituting the block copolymer is adjusted, and a method in which a homopolymer of a block constituting the block copolymer is mixed with the block copolymer. However, as shown in the Examples and Comparatives described later, the CDU-CD correlation could not be canceled by these methods.

In the present embodiment, the "poor solvent" is not particularly limited, provided that the homopolymer A is not completely dissolved in the case where a 10 wt % solution of the homopolymer A is prepared at a test temperature of 23° C. The confirmation of whether or not the homopolymer A has been completely dissolved can be evaluated, for example, by evaluating whether or not the solution is clouded by visual observation.

For example, in the case where the homopolymer A is constituted of a structural unit having an aromatic group, a structural unit derived from alkyleneoxide or a structural unit containing a polyhedral oligomeric silsesquioxane (POSS) structure, examples of poor solvent relative to homopolymer A include an alcohol solvent, such as methanol, ethanol, butanol, IPA (isopropyl alcohol), normal propyl alcohol, butanol, isobutanol, TBA (tertiary butanol), butanediol, ethylhexanol, benzyl alcohol, 1-butoxy-2-propanol, 1-methoxy-2-propanol or isopropanol; an ester solvent, such as ethyl acetate, methyl acetate, butyl acetate, methoxybutyl acetate, cellosolve acetate, amyl acetate, normal propyl acetate, isopropyl acetate, methyl lactate, ethyl lactate or butyl lactate; a hydrocarbon solvent, such as toluene, xylene, solvent naphtha, n-hexane, iso-hexane, cyclohexane, methylcyclohexane, n-heptane, isooctane or n-decane; and a ketone solvent, such as acetone, methyl ethyl ketone, cyclohexanone, methyl n-pentyl ketone, methyl isopentyl ketone or 2-heptanone. As the poor solvent, 1-butoxy-2-propanol, ethyl lactate, n-heptane, isopropanol, methyl ethyl ketone or 1-methoxy-2-propanol is preferable. As the poor solvent, 1 kind of compound may be used, or 2 or more kinds of compounds may be used in combination.

Solvent Other than Poor Solvent

In the present embodiment, as long as a solvent containing the above poor solvent is used for the block copolymer solution, a solvent other than the poor solvent may be contained in the solvent for the block copolymer solution. The solvent other than the poor solvent is not particularly limited, and examples thereof include good solvents or mixed solvents thereof. Good solvents or mixed solvents thereof are not particularly limited.

The good solvent may be any organic solvent which can form a uniform solution in the case of forming a 10 wt % homopolymer A solution at a test temperature of 23° C., one or more kinds of any organic solvent can be appropriately selected from those which have been conventionally known as solvents for dissolving a block copolymer. However, when the homopolymer A is constituted of a structural unit having an aromatic group, a structural unit derived from an alkyleneoxide or a structural unit containing a polyhedral oligomeric silsesquioxane (POSS) structure, the above-mentioned poor solvents are excluded.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These good solvents may be used individually, or in combination of two or more solvents as a mixed solvent.

Among these, propylene glycol monomethyl ether acetate (PGMEA), propylene glycol monomethyl ether (PGME), cyclohexanone and ethyl lactate (EL) are preferable.

In the present embodiment, the amount of the poor solvent to be mixed in the solvent is not particularly limited, but is preferably 50% by weight or less, more preferably 1 to 45% by weight, still more preferably 5 to 40% by weight, and most preferably 20 to 30% by weight.

In the present embodiment, the amount of solvent other than the poor solvent based on the entire solvent is not particularly limited, but is preferably 50% by weight or more, more preferably 50 to 99% by weight, and still more preferably 60 to 95% by weight.

The amount of the organic solvent in the block copolymer solution is not particularly limited, and is adjusted appropriately to a concentration that enables application of a coating solution depending on the thickness of the coating film. In general, the organic solvent is used in an amount that yields a solid content for the block copolymer that is within a range from 0.1 to 70% by weight, preferably from 0.2 to 50% by weight, and still more preferably 0.5 to 5% by weight.

Block Copolymer

A block copolymer is a polymeric material in which plurality of blocks (partial constitutional components in which the same kind of structural unit is repeatedly bonded) are bonded. As the blocks constituting the block copolymer, 2 kinds of blocks may be used, or 3 or more kinds of blocks may be used, and preferably 2 kinds of blocks are used.

In the present embodiment, the plurality of blocks constituting the block copolymer are not particularly limited, as long as they are combinations capable of causing phase separation. However, it is preferable to use a combination of blocks which are mutually incompatible.

In the case where 2 kinds of blocks, namely, block A and block B are used, examples of the block copolymer include an A-B diblock copolymer and an A-B-A triblock copolymer, and an A-B diblock copolymer is preferable.

Further, it is preferable to use a combination in which a phase of at least one block amongst the plurality of blocks constituting the block copolymer can be easily subjected to selective removal as compared to the phases of other blocks. An example of a combination which can be selectively removed reliably include a block copolymer in which one or more blocks having an etching selectivity of more than 1 are bonded.

Hereafter, among the blocks constituting the block copolymer, in an optional step described later, a block which is not selectively removed is sometimes referred to as "block $P_A$", and a block to be selectively removed is sometimes referred to as "block $P_B$".

In the present specification, a "period of a block copolymer" refers to a period of a phase structure observed when a phase-separated structure is formed, and is a sum of the lengths of the phases which are mutually incompatible. The period of a block copolymer corresponds to the length of 1 molecule of the block copolymer.

The period of a block polymer is determined by intrinsic polymerization properties such as the polymerization degree N and the Flory-Huggins interaction parameter χ. Specifically, the repulsive interaction between different block components of the block copolymer becomes larger as the χN becomes larger. Therefore, when χN>10 (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different blocks. Therefore, by adjusting the composition and the total molecular weight of the block copolymer to be used, the period of the block copolymer can be adjusted.

Examples of blocks constituting the block copolymer include a block of a structural unit having an aromatic group, a block of a structural unit derived from an (α-substituted) acrylate ester, a block of an (α-substituted) acrylic acid, a block of a structural unit derived from siloxane or a derivative thereof, a block of a structural unit derived from an alkyleneoxide, and a block of a structural unit containing a polyhedral oligomeric silsesquioxane (POSS) structure.

Examples of the structural unit having an aromatic group include structural units having a phenyl group, a naphthyl group or the like. In the present embodiment, a structural unit derived from styrene or a derivative thereof is preferable.

Examples of the styrene or derivative thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrolidone, 9-vinylanthracene, and vinylpyridine.

An (α-substituted) acrylic acid refers to either or both acrylic acid and a compound in which the hydrogen atom bonded to the carbon atom on the α-position of acrylic acid has been substituted with a substituent. As an example of such a substituent, an alkyl group of 1 to 5 carbon atoms can be given.

Examples of (α-substituted) acrylic acid include acrylic acid and methacrylic acid.

An (α-substituted) acrylate ester refers to either or both acrylate ester and a compound in which the hydrogen atom bonded to the carbon atom on the α-position of acrylate ester has been substituted with a substituent. As an example of such a substituent, an alkyl group of 1 to 5 carbon atoms can be given.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Among these, methyl acrylate, ethyl acrylate, t-butyl acrylate, methyl methacrylate, ethyl methacrylate, and t-butyl methacrylate are preferable.

Examples of siloxane or derivative thereof include dimethylsiloxane, diethylsiloxane, diphenylsiloxane, and methylphenylsiloxane.

Examples of the alkylene oxide include ethylene oxide, propylene oxide, isopropylene oxide and butylene oxide.

Specific examples of the structural unit containing a polyhedral oligomeric silsesquioxane structure include a structural unit represented by general formula (a0-1) shown below.

[Chemical Formula 1]

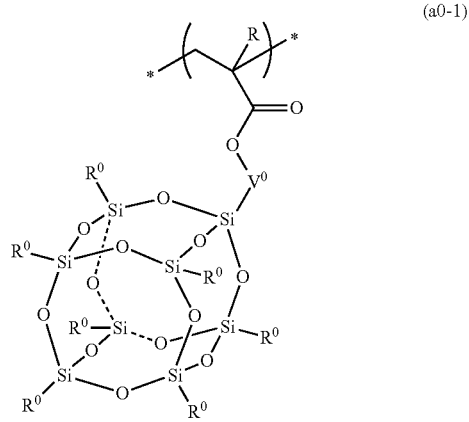

(a0-1)

In the formula, R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other. * represents a valence bond.

In the aforementioned formula (a0-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a0-1), the monovalent hydrocarbon group for $R^0$ preferably contains 1 to 20 carbon atoms, more preferably 1 to 10 carbon atoms, and still more preferably 1 to 8 carbon atoms. However, this number of carbon atoms does not include any carbon atoms within any of the substituents described below.

The monovalent hydrocarbon group for $R^0$ may be an aliphatic hydrocarbon group or an aromatic hydrocarbon group, but is preferably an aliphatic hydrocarbon group, and more preferably a monovalent aliphatic saturated hydrocarbon group (alkyl group).

More specific examples of this alkyl group include chain-like aliphatic hydrocarbon groups (linear or branched alkyl groups), and aliphatic hydrocarbon groups that include a ring within the structure.

The linear alkyl group preferably contains 1 to 8 carbon atoms, more preferably 1 to 5 carbon atoms, and still more preferably 1 to 3 carbon atoms. Specific examples include a methyl group, an ethyl group, an n-propyl group, an isopropyl group, an n-butyl group, an isobutyl group and an n-pentyl group. Among these, a methyl group, an ethyl group or an n-propyl group is preferable, a methyl group, an ethyl group or an isobutyl group is more preferable, and an ethyl group is most preferable.

The branched alkyl group preferably has 3 to 5 carbon atoms. Specific examples of such branched alkyl groups include an isopropyl group, an isobutyl group, a tert-butyl group, an isopentyl group and a neopentyl group, and an isopropyl group or a tert-butyl group is particularly desirable.

As examples of the hydrocarbon group containing a ring in the structure thereof, a cyclic aliphatic hydrocarbon group (a group in which 1 hydrogen atom has been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic hydrocarbon group is interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group, or a monocyclic group. As the monocyclic group, a group in which 1 or more hydrogen atoms have been removed from a monocycloalkane of 3 to 6 carbon atoms is preferable. Examples of the monocycloalkane include cyclopentane and cyclohexane. As the polycyclic group, a group in which 1 or more hydrogen atom has been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group may have a substituent. Examples of the substituent include a fluorine atom, a fluorinated alkyl group of 1 to 5 carbon atoms, and an oxygen atom (=O).

The cyclic aliphatic hydrocarbon group may have a substituent. Examples of the substituent include an alkyl group of 1 to 5 carbon atoms, a fluorine atom, a fluorinated alkyl group of 1 to 5 carbon atoms, and an oxygen atom (=O).

In the case where the monovalent hydrocarbon group for $R^0$ is an aromatic hydrocarbon group, the aromatic hydrocarbon group is a monovalent hydrocarbon group having at least 1 aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group).

The alkylene group which is bonded to the aforementioned aryl group or heteroaryl group preferably has 1 to 4 carbon atoms, more preferably 1 or 2 carbon atoms, and most preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In formula (a0-1), the divalent hydrocarbon group for $V^0$ may be either an aliphatic hydrocarbon group or an aromatic hydrocarbon group. An "aliphatic hydrocarbon group" refers to a hydrocarbon group that has no aromaticity.

The aliphatic hydrocarbon group as the divalent hydrocarbon group for $V^0$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group).

The alkylene group which is bonded to the aforementioned aryl group or heteroaryl group preferably has 1 to 4 carbon atoms, more preferably 1 or 2 carbon atoms, and most preferably 1 carbon atom.

Specific examples of structural unit represented by formula (a0-1) are shown below. In the formulae shown below, $R^\alpha$ represents a hydrogen atom, a methyl group or a trifluoromethyl group.

[Chemical Formula 2]

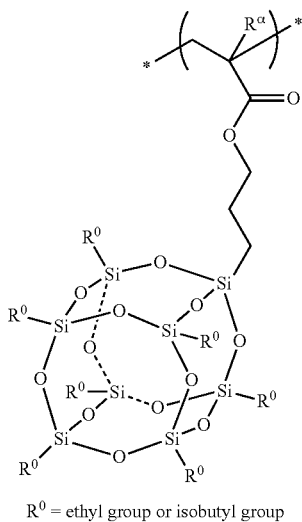

$R^0$ = ethyl group or isobutyl group

In the present embodiment, the block copolymer preferably contains 2 kinds of blocks, and an A-B diblock copolymer is more preferable.

Examples of the block copolymer with a combination of 2 kinds of blocks include a block copolymer in which a block of a structural unit having an aromatic group is bonded to a block of a structural unit derived from an (α-substituted) acrylate ester; a block copolymer in which a block of a structural unit having an aromatic group is bonded to a block of a structural unit derived from an (α-substituted) acrylic acid; a block copolymer in which a block of a structural unit having an aromatic group is bonded to a block of a structural unit derived from siloxane or a derivative thereof; a block copolymer in which a block of a structural unit derived from an alkyleneoxide is bonded to a block of a structural unit derived from an (α-substituted) acrylate ester; a block copolymer in which a block of a structural unit derived from an alkyleneoxide is bonded to a block of a structural unit derived from an (α-substituted) acrylic acid; a block copolymer in which a block of a structural unit containing a polyhedral oligomeric silsesquioxane structure is bonded to a block of a structural unit derived from an (α-substituted) acrylate ester; a block copolymer in which a block of a structural unit containing a polyhedral oligomeric silsesquioxane structure is bonded to a block of a structural unit derived from an (α-substituted) acrylic acid; and a block copolymer in which a block of a structural unit containing a polyhedral oligomeric silsesquioxane structure is bonded to a block of a structural unit derived from siloxane or a derivative thereof. Specific examples of such block copolymers include a block copolymer having a styrene block and an acrylic acid block, a block copolymer having a styrene block and a methyl acrylate block, a block copolymer having a styrene block and an ethyl acrylate block, a block copolymer having a styrene block and a t-butyl acrylate block, a block copolymer having a styrene block and a methacrylic acid block, a block copolymer having a styrene block and a methyl methacrylate block, a block copolymer having a styrene block and an ethyl methacrylate block, a block copolymer having a styrene block and a t-butyl methacrylate block, a block copolymer having a block of a polyhedral oligomeric silsesquioxane (POSS) structure-containing structural unit and an acrylic acid block, and a block copolymer having a block of a polyhedral oligomeric silsesquioxane (POSS) structure-containing structural unit and a methyl methacrylate block.

In the present embodiment, the use of a block copolymer having a block of styrene (PS) and a block of methyl methacrylate (PMMA) is particularly preferable.

In the present embodiment, the shape and size of the structure containing the phase-separated structure is determined by the volume fraction of the respective blocks constituting the block copolymer and the molecular weight of the block copolymer. For example, by making the volume fraction of the $P_B$ block within the block copolymer relatively small, a cylinder structure in which the phase of the $P_B$ block is present within the phase of the $P_A$ block in the form of a cylinder can be formed. On the other hand, by making the volume fraction of the $P_B$ block within the block copolymer about the same as that of the $P_A$ block, a lamellar structure in which the phase of the $P_A$ block and the phase of the $P_B$ block are alternately laminated can be formed. Further, by increasing the molecular weight of the block copolymer, the size of each phase can be increased.

In the present embodiment, the molar ratio of the structural units constituting the 2 kinds of blocks may be adjusted, depending on the volume fraction for obtaining an objective structure containing a phase-separated structure. Then, either one of the blocks may be designated as the homopolymer A, and a poor solvent for the homopolymer A may be selected.

For example, in the case where a cylindrical phase-separated structure is obtained from a block copolymer having a block of a structural unit having an aromatic group and a block of a structural unit derived from an (α-substituted) acrylic acid or an (α-substituted) acrylate ester, the molar ratio of the structural unit having an aromatic group to the structural unit derived from an (α-substituted) acrylic acid or an (α-substituted) acrylate ester is preferably in the range of 60:40 to 90:10, and more preferably 65:35 to 80:20.

In such a case, as described above, the hydrophobic group is the block of the structural unit having an aromatic group. Further, in the block copolymer, when the structural unit in an amount of 50 mol % or more is the structural unit having an aromatic group, it is preferable to designate the structural unit having an aromatic group as the homopolymer A. In such a case, the amount of the homopolymer A is preferably 50 to 80 mol %.

In the present embodiment, in the case where the amount of the structural unit constituting the hydrophobic block of the block copolymer is less than 50 mol %, since the block copolymer solution contains a poor solvent for homopolymer A, it is preferable to designate the structural unit in an amount of 50 mol % or more as the homopolymer A, and more preferably 50 to 80 mol %.

The weight average molecular weight (Mw) (the polystyrene equivalent value determined by gel permeation chromatography) of the block copolymer is 150,000 or more. In the present embodiment, the weight average molecular weight is preferably 160,000 or more, and more preferably 180,000 or more.

The polydispersity (Mw/Mn) of the block copolymer is preferably 1.0 to 3.0, more preferably 1.0 to 1.5, and still more preferably 1.0 to 1.3. Here, Mn is the number average molecular weight.

If desired, other miscible additives can also be added to the block copolymer solution. Examples of such miscible additives include additive resins for improving the performance of the layer of the neutralization film, surfactants for improving the applicability, dissolution inhibitors, plasticizers, stabilizers, colorants, halation prevention agents, dyes, sensitizers, base amplifiers and basic compounds.

Step of Phase-Separating a Layer Containing a Block Copolymer

In the present embodiment, after the previous step (step of applying a block copolymer solution to a substrate to form a layer containing a block copolymer and having a film thickness of less than 100 nm), the layer containing the block copolymer is phase-separated.

The phase-separation of the layer containing a block copolymer is performed by heat treatment after the formation of the layer containing a block copolymer, thereby forming a phase-separated structure. The heat treatment is preferably conducted at a temperature at least as high as the glass transition temperature of the layer containing the block copolymer used and lower than the heat decomposition temperature. For example, in the case where the block copolymer is PS-PMMA (Mw: 18-18 k), it is preferable to conduct a heat treatment at a temperature of 160 to 270° C. for 30 to 3,600 seconds.

Further, the heat treatment is preferably conducted in a low reactive gas such as nitrogen.

In the present embodiment, by the above heat treatment, a structure containing a phase separated structure in which the layer containing the block copolymer is phase-separated into a phase of $P_A$ block and a phase of $P_B$ block.

In the present embodiment, in the case where a neutralization film described later is used, a phase-separated structure may be formed on the neutralization film.

Further, in the present embodiment, in the case where a photosensitive resin pattern is formed on a neutralization film, and a layer containing a block copolymer is formed on the photosensitive resin pattern, a structure containing a phase-separated structure formed along the photosensitive resin pattern can be obtained. That is, according to the present embodiment, it is considered that the orientation of the phase-separated structure becomes controllable.

In the present embodiment, a method in which a photosensitive resin composition or the like is used as a physical guide to control the orientation of the phase-separated pattern (graphoepitaxy) may be used.

<Optional Step>

In the present embodiment, after the [step of phase-separating a layer containing a block copolymer], a pattern may be formed by selectively removing a phase of at least one block of the plurality of blocks constituting the block copolymer from the layer containing the block copolymer.

Specifically, for example, after forming a phase-separated structure, from the layer containing a block copolymer on the substrate, at least a portion of the block within the $P_B$ block phase is selectively removed (decomposition into low molecules), so as to form a pattern. By selectively removing a portion of the block $P_B$ in advance, the solubility in a developing solution can be enhanced. As a result, the phase constituted of the block $P_B$ can be more reliably removed by selective removing than the phase constituted of the block $P_A$.

The selective removal treatment is not particularly limited, as long as it is a treatment capable of decomposing and removing the $P_B$ block without affecting the $P_A$ block. The selective removal treatment can be appropriately selected from any methods for removing a resin film, depending on the types of the $P_A$ block and the $P_B$ block. Further, when a neutralization film is formed on the surface of the substrate in advance, the neutralization film is removed together with the phase of the $P_B$ block. Examples of the removal treatment include an oxygen plasma treatment, an ozone treatment, a UV irradiation treatment, a heat decomposition treatment and a chemical decomposition treatment.

The substrate having a pattern formed by the phase-separation of the layer containing the block copolymer as described above may be used as it is, or a further heat treatment may be conducted to modify the shape of the polymeric nano structure on the substrate. The heat treatment is preferably conducted at a temperature at least as high as the glass transition temperature of the block copolymer used and lower than the heat decomposition temperature. Further, the heat treatment is preferably conducted in a low reactive gas such as nitrogen.

<Neutralization Film Forming Step>

In the present embodiment, prior to the step of forming a layer containing a block copolymer on a substrate, it is preferable to conduct a step of subjecting the surface of the substrate to a neutralization treatment (i.e., step of forming a layer of a neutralization film on the substrate). A neutralization treatment is a treatment in which the surface of the substrate is modified so as to have affinity for all polymers constituting the block copolymer. By the neutralization treatment, it becomes possible to prevent only phases of specific polymers to come into contact with the surface of the substrate by phase separation. For this reason, in order to form a phase-separated structure having a lamellar structure oriented in a direction perpendicular to the substrate surface, before forming a layer containing a block copolymer, it is preferable to form a layer of the neutralization film on the substrate surface depending on the type of the block copolymer to be used.

Specifically, a thin film (neutralization film) containing a surface treating agent having affinity for all polymers constituting the block copolymer is formed on the surface of the substrate.

As the neutralization film, a film composed of a resin composition can be used. The resin composition used as the surface treating agent can be appropriately selected from conventional resin compositions used for forming a thin film, depending on the type of polymers constituting the block copolymer. The resin composition used as the surface treating agent may be a heat-polymerizable resin composition, or a photosensitive resin composition such as a positive resist composition or a negative resist composition.

Alternatively, a compound may be used as the surface treating agent, and the compound may be coated to form a non-polymerizable film as the neutralization film. For example, a siloxane organic monomolecular film formed by using a surface treating agent such as phenethyltrichlorosilane, octadecyltrichlorosilane or hexamethyldisilazane may be preferably used as a neutralization film.

The neutralization film composed of such surface treating agent can be formed by a conventional method.

Examples of the surface treating agent include a resin composition containing all structural units of the polymers constituting the block copolymer, and a resin containing all structural units having high affinity for the polymers constituting the block copolymer.

For example, when a PS-PMMA block copolymer (described later) is used, as the surface treating agent, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

Further, in the present embodiment, as described later, a pattern of a photosensitive resin may be formed on the neutralization film. Therefore, in consideration of the adhesiveness of the pattern, the neutralization film preferably exhibits a polarity close to that of the photosensitive resin composition.

[Guide Pattern Formation Step]

In the present embodiment, after the step of forming a layer of a neutralization film (undercoat agent) on the substrate and prior to the step of applying a block copolymer solution to a substrate to form a layer containing a block copolymer and having a film thickness of less than 100 nm, a guide pattern may be formed on the layer of the neutralization film. As a result, it becomes possible to control the arrangement of the phase separation structure, depending on the shape and surface properties of the guide pattern. For example, in the case of a block copolymer where a random fingerprint-patterned phase separation structure is formed without using a guide pattern, by introducing a trench pattern of a resist film on the surface of the substrate, a phase separation structure arranged along the trench can be obtained. The guide pattern can be introduced in accordance with the above-described principle. Further, when the surface of the guide pattern has affinity for any of the polymers constituting the block copolymer, a phase separation structure having a lamellar structure or a cylinder structure arranged in the perpendicular direction of the surface of the substrate can be more reliably formed.

More specifically, for example, a photosensitive resin composition (described later) is applied to the surface of the substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a guide pattern that is faithful to the mask pattern can be formed.

Alternatively, a guide pattern may be formed by nanoimprint lithography. In nanoimprint lithography, a mold having a desired pattern formed is pressed on a base having a nanoimprint material such as a resin layer on the surface thereof, and heating, exposing or the like is conducted to cure the resin layer if desired, followed by releasing the mold, thereby forming a guide pattern.

The height of the guide pattern from the surface of the substrate (or the surface of the neutralization film) is preferably at least as large as the thickness of the layer containing the block copolymer which is formed on the surface of the substrate. The height of the guide pattern from the surface of the substrate (or the surface of the neutralization film) can be appropriately adjusted by the film thickness of the resist film formed by applying the resist composition (photosensitive resin composition) for forming a guide pattern.

When the block copolymer solution is cast onto the surface of the substrate having a guide pattern formed, and a heat treatment is conducted to cause a phase separation. Therefore, the resist pattern for forming a guide pattern is preferably capable of forming a resist film which exhibits solvent resistance and heat resistance.

<Photosensitive Resin Composition>

In the present invention, the photosensitive resin composition used in the step in which a guide pattern is formed is preferably a photosensitive resin composition that generates acid upon exposure and exhibits changed solubility in a developing solution by the action of acid, and a conventional composition may be appropriately used. For example, the photosensitive resin component disclosed in WO 2012/046770 pamphlet, WO 2012/169620 pamphlet, Japanese Patent No. 5227846 and Japanese Patent No. 5225555 may be used.

As the nanoimprint material used in the method of forming a guide pattern by nanoimprint lithography, a silicone-based compound-containing material disclosed in Japanese Unexamined Patent Application, First Publication No. 2007-072374, Japanese Unexamined Patent Application, First Publication No. 2007-329276, and Japanese Unexamined Patent Application, First Publication No. 2008-246876 may be used, and an organic material in which an acrylic resin is used instead of the silicon-based compound may be used.

[Top Coat Layer Forming Step]

In the present embodiment, it is preferable that a top coat material that exhibits changed polarity by heating and contributes to the surface energy of the layer containing a block copolymer is applied to the layer containing a block copolymer to form a top coat film.

By forming a top coat film using the top coat material on the layer containing a block copolymer, the surface condition of the layer can be controlled, and phase separation may be uniformly conducted.

In the present embodiment, the formation of top coat film can be conducted by applying the top coat material to the layer 2 containing a block copolymer using a spinner or the like. After the application, bake treatment can be conducted. The heat temperature is preferably 80 to 280° C., and the heating time is preferably 10 to 600 seconds.

The thickness of the topcoat film formed on the layer 2 is preferably 2 to 500 nm, more preferably 5 to 200 nm, and still more preferably 10 to 100 nm.

By ensuring that the thickness of the topcoat film is within the aforementioned range, it is possible to block the adverse effect from the external environment sufficiently, and to bring phase separation efficiently.

As the topcoat material, the topcoat material described later can be applied.

<<Top Coat Material>>

A top coat material that is preferably used in a method of producing a structure containing a phase-separated structure according to the present invention will be described.

In the present invention, the top coat material is a top coat material (hereinafter, sometimes referred to as "top coat material (1)") that includes a polymeric compound containing a structural unit (Tc1) that exhibits changed polarity by heating and a surface energy control agent that contributes to a surface energy of the layer containing a block copolymer.

The top coat material of the present invention may be a top coat material (hereinafter, sometimes referred to as "top coat material (2)") includes a polymeric compound containing a structural unit (Tc1) that exhibits changed polarity by heating and a structural unit (Tc2) that contributes to a surface energy of the layer containing a block copolymer.

<Top Coat Material (1)>

The top coat material (1) is a top coat material that includes a polymeric compound containing a structural unit (Tc1) that exhibits changed polarity by heating and a surface energy control agent that contributes to a surface energy of the layer containing a block copolymer.

(Polymeric Compound)

A polymeric compound used in the top coat material (1) contains a structural unit (Tc1) that exhibits changed polarity by heating.

By including the structural unit (Tc1), the surface energy of the layer containing the block copolymer can be maintained in an appropriate level during the phase separation.

The "structural unit that exhibits changed polarity by heating" refers to a repeating unit that changes the structure thereof by heating and changes the structure of the polar group thereof. As a structural unit (Tc1), a repeating unit can be mentioned, in which the structure of the polar group is changed when the ring-opening structure is converted to a ring-closed structure by dehydration condensation due to heating.

Examples of the polar group include $-COO^-$, $-SO_3^-$, $-NH_4^+$; a hydroxy group, an amino group and a sulfo group ($-SO3H$).

As an example of the structural unit (Tc1), a structural unit represented by chemical formula shown below can be given.

The structural unit represented by chemical formula (Tc1-1) is a structural unit that exhibits increased polarity by heating in the presence of basic component. The structural unit represented by chemical formula (Tc1-2) is a structural unit that exhibits decreased polarity by heating.

[Chemical Formula 3]

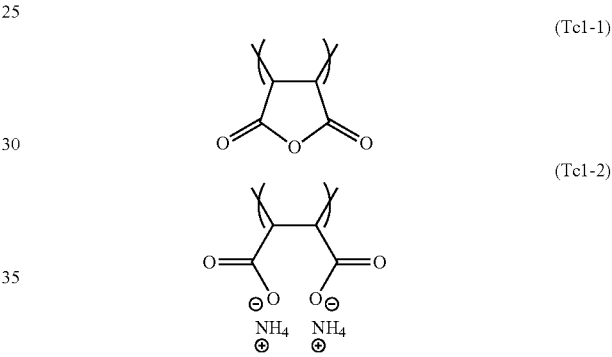

As the structural unit (Tc1) contained in the polymeric compound, 1 type of structural unit may be used, or 2 or more types may be used.

The type of the structural unit (Tc1) selected from the group consisting of a structural unit that exhibits increased polarity by heating and a structural unit that exhibits decreased polarity by heating can be appropriately determined, taking into consideration the type of the block copolymer or the level of the surface energy of the layer containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

The polymeric compound used in the top coat material (1) may contain a structural unit other than the structural unit (Tc1).

Examples of the structural unit other than the structural unit (Tc1) include a structural unit (Tc2) that contributes the surface energy of the layer containing the block copolymer, a structural unit (Tc3) that contributes to the glass transition temperature (Tg).

Structural Unit (Tc2)

Examples of the structural unit (Tc2) include the same structural units as those described above for the structural unit (Tc2) that will be explained in <Top coat material (2)> described later.

As the structural unit (T2) contained in the polymeric compound, 1 kind of structural unit may be used, or 2 or more kinds of structural units may be used.

As the structural unit (Tc2), it is preferable to include at least one structural unit selected from the group consisting of a structural unit represented by general formula (Tc2-1) described later, a structural unit represented by general formula (Tc2-2) described later and a structural unit represented by general formula (Tc2-3) described later; and it is more preferable to include at least one structural unit selected from the group consisting of a structural unit represented by general formula (Tc2-1) described later and a structural unit represented by general formula (Tc2-2) described later.

When the polymeric compound includes the structural unit (Tc2), the amount of the structural unit (Tc2) within the polymeric compound, based on the combined total of all the structural units that constitute the polymeric compound, is preferably within a range from 10 to 90 mol %, more preferably from 20 to 70 mol %, and still more preferably from 20 to 60 mol %.

When the amount of the structural unit (Tc2) is within the aforementioned range, the layer containing the block copolymer having a desirable surface energy may be given.

In the top coat material (1), as the polymeric compound containing the structural unit (Tc1), one kind of polymeric compound may be used alone, or two or more kinds of polymeric compounds may be used in combination.

The polymeric compound used in the top coat material (1) is a polymer containing at least the structural unit (Tc1), and preferably a copolymer having the structural unit (Tc2), in addition to the structural unit (Tc1).

Among these copolymers, it is preferable to include a copolymer containing a repeating structure of a structural unit represented by the aforementioned general formula (Tc1-1) described later, a structural unit represented by chemical formula (Tc2-1) described later and structural unit represented by general formula (Tc2-2) described later.

Specific examples of preferable polymer compound used for the top coat material (1) include the same polymeric compounds as those explained in <Top coat material (2)> described later.

The weight average molecular weight (Mw) (the polystyrene equivalent value determined by gel permeation chromatography) of the polymeric compound used for the top coat material (1) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (1), the amount of the polymeric compound can be appropriately adjusted depending on the thickness of the topcoat film to be formed, and the like. In the topcoat material (1), the concentration of the polymeric compound is preferably 0.1 to 15% by weight, and more preferably 0.2 to 7% by weight.

(Surface Energy Control Agent)

A top coat material (1) contains a surface energy control agent that contributes to a surface energy of the layer containing a block copolymer explained in <<method of producing structure containing phase-separated structure>>, in addition to the polymeric compound containing the structural unit (Tc1).

By including the surface energy control agent, the surface energy of the layer containing the block copolymer can be adjusted to an appropriate level during the phase separation.

Examples of the surface energy control agent include a component (i.e., cross-linking agent) that form an intermolecular or intramolecular chemical bond of the polymeric compounds in the top coat material by heating.

Specific examples of the surface energy control agent include cross-linking agents such as diamines, triamines and the like. Among these, a diamine or a triamine is preferably used, and a diamine is particularly preferably used.

Preferred examples of the surface energy control agents are shown below.

[Chemical Formula 4]

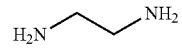 (Sc-1)

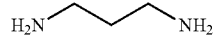 (Sc-2)

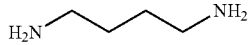 (Sc-3)

 (Sc-4)

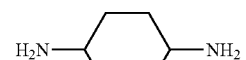 (Sc-5)

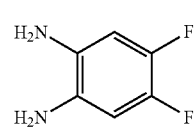 (Sc-6)

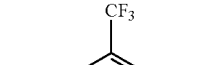 (Sc-7)

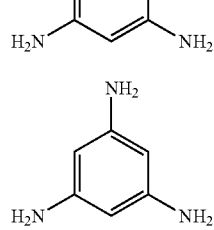 (Sc-8)

In the top coat material (1), as the surface energy control agent, one type of surface energy control agent may be used alone, or two or more types of surface energy control agents may be used in combination.

In the top coat material (1), the amount of the surface energy control agent relative to 100 parts by weight of the polymeric compound is preferably 2 to 500 parts by weight, and more preferably 5 to 300 parts by weight.

When the amount of the surface energy control agent is at least as large as the lower limit of the above-mentioned range, the surface energy of the layer containing the block copolymer having a preferable surface energy may be given. On the other hand, when the amount of the surface energy control agent is no more than the upper limit of the above-mentioned range, the film formability becomes excellent.

(Optional Components)

If desired, other miscible additives can also be added to the top coat material (1), in addition to the polymeric compound and the surface energy control agent.

Solvent

The top coat material (1) can be produced by dissolving the polymeric compound and the surface energy control agent in a solvent.

As a solvent, any solvents can be used, as long as it dissolves the respective components so as to give a uniform solution. Examples the solvents include water, aqueous ammonia (preferably 10 to 50% by weight), methanol, a mixed solvent of methanol and aqueous ammonia, a mixed solvent of water and methanol, a mixed solvent of aqueous ammonia and ethanol.

<Top Coat Material (2)>

A top coat material (2) includes a polymeric compound containing a structural unit (Tc1) that exhibits changed polarity by heating and a structural unit (Tc2) that contributes to the a surface energy of the layer containing a block copolymer.

(Polymeric Compound)

A polymeric compound used in the top coat material (2) contains a structural unit (Tc1) that exhibits changed polarity by heating and a structural unit (Tc2) that contributes to a surface energy of the layer containing a block copolymer.

Structural Unit (Tc1)

Examples of the structural unit (Tc1) include the same structural units as those described above for the structural unit (Tc1) that will be explained in the aforementioned <Top coat material (1)>.

As the structural unit (Tc1) contained in the polymeric compound, 1 type of structural unit may be used, or 2 or more types may be used.

The type of the structural unit (Tc1) selected from the group consisting of a structural unit that exhibits increased polarity by heating and a structural unit that exhibits decreased polarity by heating can be appropriately determined, taking into consideration the type of the block copolymer or the level of the surface energy of the layer containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

Structural Unit (Tc2)

A structural unit (Tc2) is a structural unit that contributes to a surface energy of the layer containing a block copolymer.

By including the structural unit (Tc2), the layer containing the block copolymer having an appropriate surface energy can be given through phase separation.

As the structural unit (Tc2), any structural units can be used, as long as it contributes to polarity of the polymeric compound containing the structural unit (Tc1). It is preferable to include at least one structural unit selected from the group consisting of a structural unit represented by general formula (Tc2-1) shown below, a structural unit represented by general formula (Tc2-2) shown below and a structural unit represented by general formula (Tc2-3) shown below.

[Chemical Formula 5]

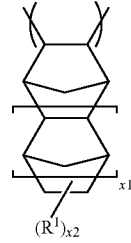

(Tc2-1)

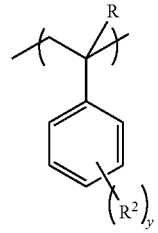

(Tc2-2)

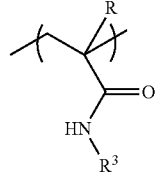

(Tc2-3)

In the formulae, x1 represents 0 or 1; $R^1$ represents a fluorine atom or a hydrocarbon group which may have a fluorine atom or an oxygen atom; x2 represents an integer of 0 to 4; R represents a hydrogen atom, an alkyl group of 1 to 5 carbon atoms or a halogenated alkyl group of 1 to 5 carbon atoms; and the plurality of R may be the same or different from each other; $R^2$ represents a fluorine atom or a hydrocarbon group which may have a fluorine atom or an oxygen atom; y represents an integer of 0 to 3; $R^3$ represents a hydrocarbon group with or without a substituent; wherein the substituent for $R^3$ is a fluorine atom or a hydrocarbon group with or without a fluorine atom or an oxygen atom.

In general formula (Tc2-1) above, x represents 0 or 1.

x2 represents an integer of 0 to 4, is preferably an integer of 0 to 2, is more preferably either 0 or 1, and is most preferably 1.

In formula (Tc2-1), $R^1$ represents a fluorine atom or a hydrocarbon group which may have a fluorine atom or an oxygen atom. The monovalent hydrocarbon group for $R^1$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

More specific examples of this alkyl group include chain-like aliphatic hydrocarbon groups (linear or branched alkyl groups), and aliphatic hydrocarbon groups that include a ring within the structure.

The linear alkyl group preferably contains 1 to 8 carbon atoms, more preferably 1 to 5 carbon atoms, and still more preferably 1 to 3 carbon atoms. Specific examples include a methyl group, an ethyl group, an n-propyl group, an n-butyl group and an n-pentyl group. Among these, a methyl group, an ethyl group or an n-propyl group is preferable, and a methyl group or an ethyl group is more preferable.

The branched alkyl group preferably has 3 to 10 carbon atoms, more preferably 3 to 8, and most preferably 3 to 6.

As examples of the hydrocarbon group containing a ring in the structure thereof, a cyclic aliphatic hydrocarbon group (a group in which 1 hydrogen atom has been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic hydrocarbon group is interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group, or a monocyclic group. As the monocyclic group, a group in which 1 or more hydrogen atoms have been removed from a monocycloalkane of 3 to 6 carbon atoms is preferable. Examples of the monocycloalkane include cyclopentane and cyclohexane. As the polycyclic group, a group in which 1 or more hydrogen atom has been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group and the cyclic aliphatic hydrocarbon group may contain a fluorine atom or an oxygen atom. In other words, the hydrogen atom in the aliphatic hydrocarbon group may be substituted with a fluorine atom. The methylene group (—$CH_2$—) in the aliphatic hydrocarbon group may be substituted with an oxygen atom (—O—) or a carbonyl group (—C(=O)—).

When the monovalent hydrocarbon group for $R^1$ is an aromatic hydrocarbon group, the aromatic hydrocarbon group is a monovalent hydrocarbon group having at least one aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group).

The alkylene group which is bonded to the aforementioned aryl group or heteroaryl group preferably has 1 to 4 carbon atoms, more preferably 1 or 2 carbon atoms, and most preferably 1 carbon atom.

The aromatic hydrocarbon group may contain a fluorine atom or an oxygen atom. In other words, the hydrogen atom in the aromatic hydrocarbon group may be substituted with a fluorine atom. The methylene group (—$CH_2$—) in the aromatic hydrocarbon group may be substituted with an oxygen atom (—O—) or a carbonyl group (—C(=O)—).

In the aforementioned general formulae (Tc2-2) and (Tc2-3), R represents a hydrogen atom, an alkyl group of 1 to 5 carbon atoms or a halogenated alkyl group of 1 to 5 carbon atoms. Here, the plurality of the R group may be the same or different from each other.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (Tc2-2), $R^2$ is the same as defined for $R^1$ in general formula (Tc2-1).

y represents an integer of 0 to 3, is preferably an integer of 0 to 2, is more preferably either 1 or 2, and is most preferably 1.

In general formula (Tc2-3), $R^3$ represents a hydrocarbon group which may have a substituent.

The hydrocarbon group for $R^3$ is the same hydrocarbon group as those described above for $R^1$ in general formula (Tc2-1).

Examples of the substituent for $R^3$ include a fluorine atom or a hydrocarbon group which may have a fluorine atom or an oxygen atom, and are the same groups as those described above for $R^1$ in the aforementioned formula (Tc2-1).

Specific examples of structural units represented by the general formula (Tc2-1) are shown below.

In the formula, $R^{11}$ represents a hydrogen atom or a hydrocarbon group which may have a fluorine atom.

The hydrocarbon group for $R^{11}$ is the same hydrocarbon group as those described above for $R^1$ in general formula (Tc2-1). In the chemical formula, the wavy line refers to both "wedge bond" and "dashed line bond".

[Chemical Formula 6]

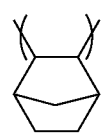 (Tc2-1-1)

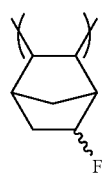 (Tc2-1-2)

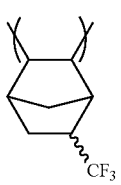 (Tc2-1-3)

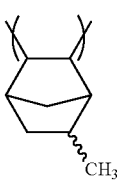 (Tc2-1-4)

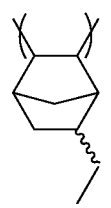 (Tc2-1-5)

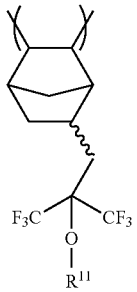 (Tc2-1-6)

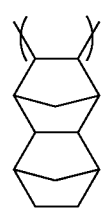 (Tc2-1-7)

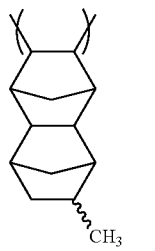 (Tc2-1-8)

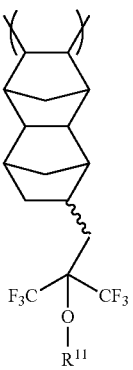 (Tc2-1-9)

Specific examples of structural units represented by the general formula (Tc2-2) are shown below. In the formulae shown below, $R^{\alpha}$ represents a hydrogen atom, a methyl group or a trifluoromethyl group.

In the formula, $R^{12}$ represents a hydrogen atom or a hydrocarbon group which may have a fluorine atom.

The hydrocarbon group for $R^{12}$ is the same hydrocarbon group as those described above for $R^1$ in general formula (Tc2-1).

[Chemical Formula 7]

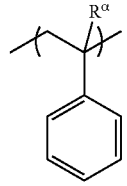 (Tc2-2-1)

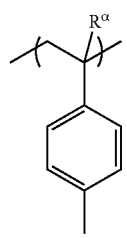 (Tc2-2-2)

(Tc2-2-3) 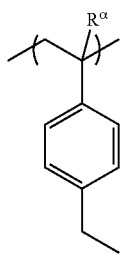

(Tc2-2-4) 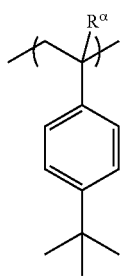

(Tc2-2-5) 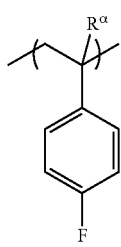

(Tc2-2-6) 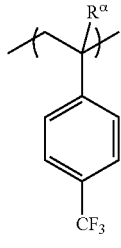

(Tc2-2-7) 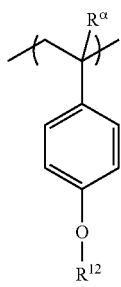

(Tc2-2-8) 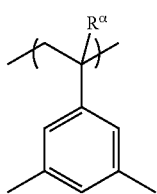

(Tc2-2-9) 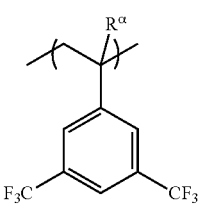

(Tc2-2-10) 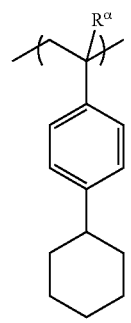

Specific examples of structural units represented by the general formula (Tc2-3) are shown below. In the formulae shown below, $R^{\alpha}$ represents a hydrogen atom, a methyl group or a trifluoromethyl group.

In the formula, $R^{13}$ represents a hydrogen atom or a hydrocarbon group which may have a fluorine atom.

The hydrocarbon group for $R^{13}$ is the same hydrocarbon group as those described above for $R^1$ in general formula (Tc2-1).

[Chemical Formula 8]

(Tc2-3-1) 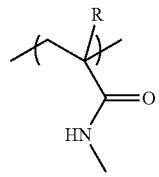

(Tc2-3-2) 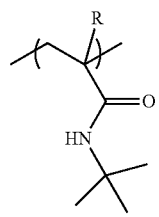

(Tc2-3-3) 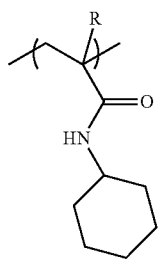

-continued (Tc2-3-4)

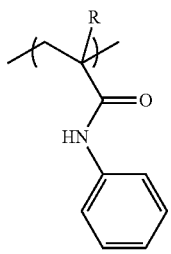

(Tc2-3-5)

(Tc2-3-6)

(Tc2-3-7)

(Tc2-3-8)

-continued (Tc2-3-9)

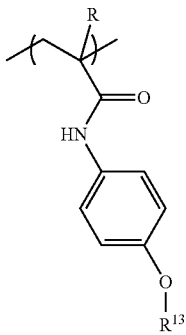

As the structural unit (T2) contained in the polymeric compound, 1 kind of structural unit may be used, or 2 or more kinds of structural units may be used.

As the structural unit (Tc2), it is preferable to include at least one structural unit selected from the group consisting of a structural unit represented by the aforementioned general formula (Tc2-1), a structural unit represented by the aforementioned general formula (Tc2-2) and a structural unit represented by the aforementioned general formula (Tc2-3).

As a structural unit (Tc2) it is more preferable to include at least one structural unit selected from the group consisting of a structural unit represented by the aforementioned general formula (Tc2-1) and a structural unit represented by the aforementioned general formula (Tc2-2).

In the polymeric compound, the amount of the structural unit (Tc2) based on the combined total of all structural units constituting the polymeric compound is preferably 10 to 90 mol %, more preferably 20 to 70 mol %, and still more preferably 20 to 60 mol %.

When the amount of the structural unit (Tc2) is within the aforementioned range, the layer containing the block copolymer having a desirable surface energy may be given.

The polymeric compound used in the top coat material (2) may contain a structural unit other than the structural unit (Tc1) or (Tc2).

Examples of the structural unit other than the structural unit (Tc1) or (Tc2) include a structural unit (Tc3) that contributes to the glass transition temperature (Tg).

In the top coat material (2), as the polymeric compound containing the structural unit (Tc1) or (Tc2), one kind of polymeric compound may be used alone, or two or more kinds of polymeric compounds may be used in combination.

The polymeric compound used in the top coat material (2) is a polymer containing at least the structural unit (Tc1) and the structural unit (Tc2).

More specifically, preferable examples of the copolymer include a copolymer containing a repeating structure of a structural unit represented by general formula (Tc1-2) a structural unit represented by general formula (Tc2-1); a copolymer containing a repeating structure of a structural unit represented by general formula (Tc1-2) and a structural unit represented by general formula (Tc2-2); a copolymer containing a repeating structure of a structural unit represented by general formula (Tc1-2) and a structural unit represented by general formula (Tc2-3); a copolymer containing a repeating structure of a structural unit represented by general formula (Tc1-2), a structural unit represented by general formula (Tc2-1) and a structural unit represented by general formula (Tc2-2); a copolymer containing a repeating structure of a structural unit represented by general formula (Tc1-2), a structural unit represented by general formula (Tc2-1) and a structural unit represented by general formula (Tc2-3); a copolymer containing a repeating structure of a structural unit represented by general formula (Tc1-2), a structural unit represented by general formula (Tc2-2) and a structural unit represented by general formula (Tc2-3); and a copolymer containing a repeating structure of a structural unit represented by general formula (Tc1-1), a structural unit represented by general formula (Tc2-1) and a structural unit represented by general formula (Tc2-2). Among these copolymers, it is preferable to include a copolymer containing a repeating structure of a structural unit represented by general formula (Tc1-1), a structural unit represented by general formula (Tc2-1) and structural unit represented by general formula (Tc2-2).

Specific examples of polymeric compounds used in the top coat material (2) are shown below.

In the formulae, $R^1$, $R^2$, $R^3$ and y are respectively the same as defined for $R^1$, $R^2$, $R^3$ and y in the formulae (Tc2-1) to (Tc2-3).

In the formulae, $R^{1a}$ and $R^{1b}$ are the same as defined for $R^1$ in the formula (Tc2-1).

$R^{2a}$ and $R^{2b}$ are the same as defined for $R^2$ in the formula (Tc2-2).

$y_1$ and $y_2$ are the same as defined for y in the formula (Tc2-2).

$R^{3a}$ and $R^{3b}$ are the same as defined for $R^3$ in the formula (Tc2-3).

[Chemical Formula 9]

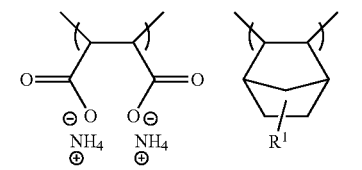
(TC1)

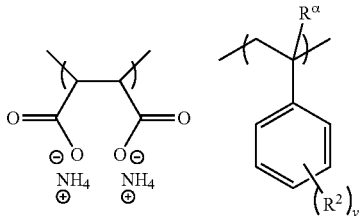
(TC2)

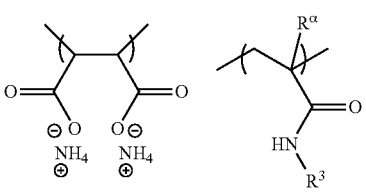
(TC3)

[Chemical Formula 10]

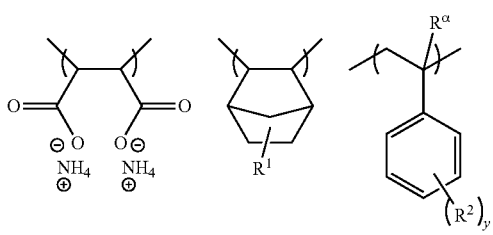
(TC4)

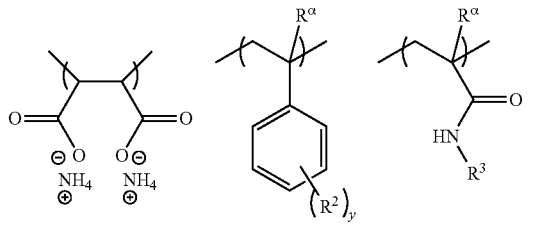
(TC5)

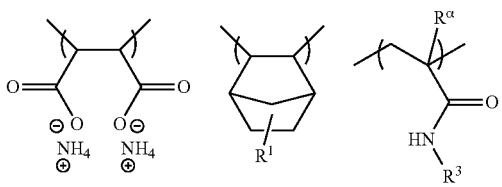
(TC6)

[Chemical Formula 11]

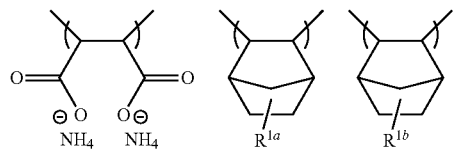
(TC7)

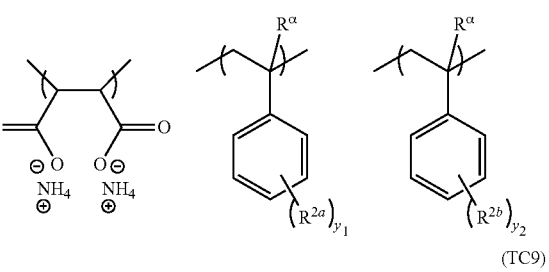
(TC8)

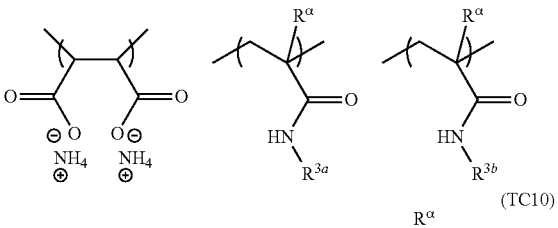
(TC9)

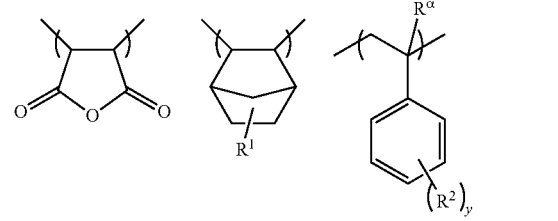
(TC10)

The weight average molecular weight (Mw) (the polystyrene equivalent value determined by gel permeation chromatography) of the polymeric compound used for the top coat material (2) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (2), the amount of the polymeric compound can be appropriately adjusted depending on the thickness of the topcoat film to be formed, and the like. In the topcoat material (2), the concentration of the polymeric compound is preferably 0.1 to 15% by weight, and more preferably 0.2 to 7% by weight.

(Optional Components)

If desired, other miscible additives such as the surface energy control agent can also be added to the top coat material (2), in addition to the polymeric compound.

Solvent

The top coat material (2) can be produced by dissolving the polymeric compound in a solvent.

As a solvent, any solvents can be used, as long as it dissolves the respective components so as to give a uniform solution. Examples the solvents include water, aqueous ammonia (preferably 10 to 50% by weight), methanol, a mixed solvent of methanol and aqueous ammonia, a mixed solvent of water and methanol, a mixed solvent of aqueous ammonia and ethanol.

In the case where the [Top coat layer forming step] is included, the selective removal may be conducted without removing the top coat film; however, the present embodiment is not limited thereto, and the selective removal may be conducted after removing the top coat film. In the case where the block phase is removed after removing the top coat film, it is preferable that the top coat film can be uniformly removed.

The removal of the top coat film may be appropriately conducted depending on the kind of top coat material used.

The top coat film may be removed by applying the solvent for the top coat material to the top coat film. The solvent for the top coat material is the same as defined above.

The substrate having a pattern formed by the phase-separation of the layer containing the block copolymer as described above may be used as it is, or a further heat treatment may be conducted to modify the shape of the polymeric nano structure on the substrate. The heat treatment is preferably conducted at a temperature at least as high as the glass transition temperature of the block copolymer used and lower than the heat decomposition temperature. Further, the heat treatment is preferably conducted in a low reactive gas such as nitrogen.

EXAMPLES

The present invention will be described more specifically with reference to the following examples, although the scope of the present invention is by no way limited by these examples. The mixed solvents are all indicated in terms of weight ratio.

<<Solubility Test>>

To each solvent shown in Table 1 was added 1 g of polystyrene to obtain a concentration of 10% by weight, so as to conduct a solubility test. After adding polystyrene, the resultant was visually observed. With respect to a solution which was clouded, the solvent was defined as a poor solvent, and with respect to a solution which was not clouded, the solvent was defined as a good solvent. The results are shown in Table 1.

TABLE 1

| Solvent | Solubility |
|---|---|
| 1 | Good solvent |
| 2 | Poor solvent |
| 3 | Good solvent |
| 4 | Poor solvent |
| 5 | Poor solvent |
| 6 | Poor solvent |
| 7 | Poor solvent |
| 8 | Poor solvent |
| 9 | Good solvent |
| 10 | Good solvent |

In Table 1, the reference numbers indicate the following.
1: propyleneglycol monomethyletheracetate (PGMEA)
2: 1-butoxy-2-propanol
3: ethylethoxypropionate
4: ethyl lactate
5: heptane
6: isopropanol
7: methyl ethyl ketone
8: propylene glycol monomethyl ether (PGME)
9: γ-butyrolactone
10: butyl acetate Examples 1 to 4, Comparative Example 1

A PS-PMMA block copolymer (Mw=150,000; PS/PMMA compositional ratio (molar ratio)=70/30; polydispersity=1.02; period=51 nm) was dissolved in a solvent having a formulation indicated in Table 2, so as to prepare a block copolymer solution.

An organic anti-reflection film composition (product name: ARC29A, manufactured by Brewer Science Ltd.) was applied to an 8-inch silicon wafer using a spinner, and the composition was then baked on a hot plate at 205° C. for 60 seconds and dried, thereby forming an organic anti-reflection film having a film thickness of 82 nm.

To the organic anti-reflection film, as a neutralization film, a resin composition (a copolymer of styrene/3,4-epoxycyclohexylmethane methacrylate/propyltrimethoxysilane methacrylate=88/17/5 with Mw=43, 400 and Mw/Mn=1.77) adjusted to a concentration of 0.5 to 1.0% by weight with PGMEA was applied using a spinner, followed by baking at 250° C. for 2 minutes and dried, thereby forming a layer of the neutralization film with a film thickness of 10 nm on the substrate.

Subsequently, on the layer of the neutralization film, a 2 wt % solution of the PS-PMMA block copolymer (Examples 1 to 4, Comparative Example 1) was spin-coated (number of rotation: 1,500 rpm, 60 seconds).

Layers of the block copolymer having thicknesses of 17 nm, 20 nm, 22 nm, 25 nm, 28 nm and 30 nm were formed. Then, the substrate having the PS-PMMA block copolymer coated thereon was heated at 240° C. for 60 seconds while flowing nitrogen for annealing, thereby forming a phase-separated structure. The phase-separated structure was subjected to image analysis, so as to determine the hole dimension and the in-plane uniformity of the hole dimension.

[Evaluation of In-Plane Uniformity (CDU) of Pattern Size]

With respect to each CH pattern obtained above, 100 holes in the CH pattern were observed from the upper side thereof using a measuring scanning electron microscope (SEM) (product name: S-9380, manufactured by Hitachi High-Technologies Corporation; acceleration voltage: 300V), and the hole diameter (nm) of each hole was measured. From the results, the value of 3 times the standard deviation a (i.e., 3σ) was determined. The results are indicated under "CDU (nm)" in Table 2. In Table 2, the average value obtained by changing the film thickness of the block copolymer (17 nm, 20 nm, 22 nm, 25 nm, 28 nm and 30 nm) is indicated under "Average CDU".

The smaller the thus determined 3σ value is, the higher the level of the dimension uniformity (CD uniformity) of the plurality of holes formed in the resist film.

In Table 2, CD (nm) is also indicated. Like the CDU, CD is the average value obtained by changing the film thickness of the block copolymer (17 nm, 20 nm, 22 nm, 25 nm, 28 nm and 30 nm) indicated under "Average CD".

TABLE 2

| | Solvent | Average CD (nm) | Average CDU |
|---|---|---|---|
| Comparative Example 1 | 1 [100] | 18.8 | 6.06 |
| Example 1 | 1/8 [90/10] | 18.2 | 6.04 |
| Example 2 | 1/8 [80/20] | 18.2 | 5.81 |
| Example 3 | 1/8 [70/30] | 18.3 | 5.17 |
| Example 4 | 1/8 [60/40] | 17.9 | 5.88 |

As seen from the results shown in Table 2, from the comparison between Comparative 1 and Examples 1 to 4, although the Average CD was about the same level, the CDU value became smaller, meaning that the CDU was improved.

Comparative Examples 3 to 5

Comparative Example 3

A pattern was formed in the same manner as in Example 1, except that 1 [100], 1/9 [90/10], 1/9[75/25], 1/9 [50/50] and 9 [100] were used as solvents for the block copolymer. In Comparative Example 3, a cylinder pattern could not be formed using any of the solvents.

Comparative Example 4

A pattern was formed in the same manner as in Example 1, except that 1 [100], 1/10 [90/10], 1/10 [75/25], 1/10 [50/50] and 10 [100] were used as solvents for the block copolymer. Also in Comparative Example 4, a cylinder pattern could not be formed using any of the solvents.

Comparative Example 5

A pattern was formed in the same manner as in Example 1, except that 1 [100], 1/8 [90/10], 1/8 [75/25], 1/8 [50/50] and 8 [100] were used as solvents for the block copolymer. In Comparative Example 5, a cylinder pattern could not be formed using any of the solvents.

Examples 5 to 20, Comparative Examples 6 and 7

A pattern was formed in the same manner as in Example 1, except that the solvents indicated in Tables 3 and 4 below were used, and the coating film thickness of the block copolymer was changed to 30 nm. With respect to the formed pattern, the CDU was evaluated in the same manner as in Example 1. The results are shown in Tables 3 and 4.

TABLE 3

| | Solvent | CD (nm) | CDU |
|---|---|---|---|
| Example 5 | 1/2 [90/10] | 17.8 | 6.3 |
| Example 6 | 1/4 [70/30] | 18.1 | 6.1 |
| Example 7 | 1/4 [80/20] | 19.1 | 5.2 |
| Example 8 | 1/4 [90/10] | 17.7 | 6.3 |
| Example 9 | 1/5 [70/30] | 17.7 | 5.8 |
| Example 10 | 1/5 [80/20] | 17.7 | 4.9 |
| Example 11 | 1/5 [90/10] | 18.1 | 5.5 |
| Example 12 | 1/6 [70/30] | 18.5 | 6.2 |
| Example 13 | 1/6 [80/20] | 18.5 | 6.2 |
| Example 14 | 1/6 [90/10] | 18.3 | 5.8 |
| Example 15 | 1/7 [70/30] | 17.5 | 6.1 |
| Example 16 | 1/7 [80/20] | 21.0 | 5.8 |
| Example 17 | 1/7 [90/10] | 17.4 | 5.4 |
| Example 18 | 1/8 [70/30] | 17.6 | 5.2 |
| Example 19 | 1/8 [80/20] | 18.1 | 5.8 |
| Example 20 | 1/8 [90/10] | 17.8 | 5.7 |

TABLE 4

| | Solvent | CD (nm) | CDU |
|---|---|---|---|
| Comparative Example 6 | 1 [100] | 18.6 | 7.0 |
| Comparative Example 7 | 1/3 [80/20] | 18.0 | 7.7 |

Figure 2:
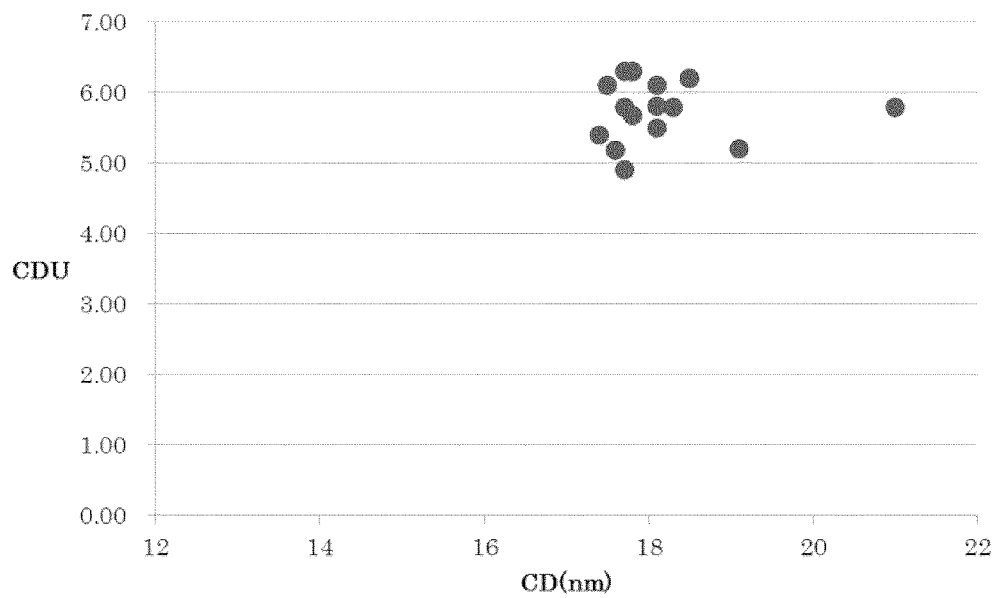
FIG. 2 is a diagram showing an example of CDU-CD correlation in example.

The CDU-CD correlation in Examples 5 to 20 are shown in FIG. 2. As shown in FIG. 2, it was found that, in Examples 5 to 20 using a solvent having a poor solvent added, the CDU-CD correlation could be canceled.

Comparative Example 6

The CDU-CD correlation in the case where the styrene content of the block copolymer was changed and the CDU-CD correlation in the case where a styrene homopolymer was mixed were studied.

The results are shown in FIG. 1. As shown in FIG. 1, in the case where the styrene content of the block copolymer was changed and in the case where a styrene homopolymer was mixed, the CDU-CD correlation could not be canceled.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a structure containing a phase-separated structure, the method comprising:
preparing a block copolymer solution consisting of one polystyrene-poly(methyl methacrylate) block copolymer and a mixture of solvents, wherein the molar ratio of the structural unit derived from styrene to the structural unit derived from methyl methacrylate is 70:30;
applying the block copolymer solution to a substrate to form a layer containing a block copolymer and having a film thickness of less than 100 nm; and
phase-separating the layer containing the block copolymer,
wherein the mixture of solvents comprises propylene glycol monomethyl ether acetate and 1-methoxy-2-propanol, and
the amount of 1-methoxy-2-propanol is 10 to 30% by weight, and the amount of propylene glycol monomethyl ether acetate is 70 to 90% by weight, wherein the total of 1-methoxy-2-propanol and propylene glycol monomethyl ether acetate is 100% by weight, based on the weight of the solvent of the block copolymer solution.

2. The method according to claim 1, further comprising forming a neutralization film on the substrate.

* * * * *